United States Patent [19]
Kang

[11] Patent Number: 5,453,743
[45] Date of Patent: Sep. 26, 1995

[54] TWO-DIMENSIONAL SYMMETRIC THERMOMETER MATRIX DECODER OF DIGITAL/ANALOG CONVERTER

[75] Inventor: Ku-Chang Kang, Seoul, Rep. of Korea

[73] Assignee: Hyundai Electronics Industries, Co., Ltd., Kyoungki-do, Rep. of Korea

[21] Appl. No.: 998,049

[22] Filed: Dec. 29, 1992

[30] Foreign Application Priority Data

Dec. 31, 1991 [KR] Rep. of Korea ............ 91-25760

[51] Int. Cl.⁶ ............................................. H03M 1/66
[52] U.S. Cl. ........................................................ 341/144
[58] Field of Search ............................. 341/144, 133, 341/134, 135, 136, 145, 146, 148, 153, 154

[56] References Cited

U.S. PATENT DOCUMENTS

| | | |
|---|---|---|
| 4,393,370 | 7/1983 | Hareyama. |
| 4,490,634 | 12/1984 | Hareyama. |
| 4,665,381 | 5/1987 | Masuda et al.. |
| 4,910,514 | 3/1990 | Irmer et al. ............ 341/144 X |
| 5,057,838 | 10/1991 | Tsuji et al. ............ 341/144 |
| 5,105,193 | 4/1992 | Vogt et al. ............ 341/154 |

Primary Examiner—Brian K. Young
Attorney, Agent, or Firm—Ladas & Parry

[57] ABSTRACT

A two-dimensional symmetric thermometer matrix decoder of digital/analog converter reduces an integral non-linearity error due to the current gradient of the current sources by making the current sources two-dimensional and symmetrical when selecting the current sources. Up until now, the number of current sources had to be smaller than a half the amount of the current that flows when one current source is activated, and the number of digital bits of a digital/analog converter that can be increased used to be limited because an integral non-linearity error value becomes larger as the number of the current sources increases. To solve such problems, the present invention activates a current source located in the center of the current source array, and then two current sources located on the right and the left side of the centrally located current source are activated. Also, for the rows which are a group of current sources, a centrally located row is activated first and then the rows located above and below are symmetrically activated so that the next current sources mutually offset the error with each other, thereby reducing an integral non-linearity error. By doing so, a converter with a higher-resolution can be manufactured.

1 Claim, 3 Drawing Sheets

TWO-DIMENSIONAL SYMMETRIC THERMOMETER MATRIX DECODER OF DIGITAL/ANALOG CONVERTER

BACKGROUND OF THE INVENTION

This invention relates to a digital/analog converter and more particularly to a two-dimensional symmetric thermometer matrix decoder of digital/analog converter designed to reduce an integral non-linearity error due to current gradient of a current source by making a selected current source two-dimensional and symmetrical.

A conventional digital/analog converter, as shown in FIG. 1, is run using an unweighted thermometer method where the current is gained by activating current sources I1–In capable of flowing the current. The digital/analog converter that is run with an un-weighted thermometer method outputs Io=I1+I2+ . . . In= nI . . . (1). Wherein, n is an integer.

However, on a real device, it is impossible to make current sources that are exactly the same. Thus, as shown in FIG. 2, the current value of each current source differs from each other causing an integral non-linearity error whose actual value is different from its theoretical value as depicted in FIG. 3. In a digital/analog converter, this error must be smaller than a half the amount of the current flowing when one current source is being activated. However, the value of an integral non-linearity error increases as the number of the current sources becomes larger, thereby restricting the increase in the number of digital bits used in a digital/analog converter.

SUMMARY OF THE INVENTION

A two-dimensional symmetric thermometer matrix decoder of a digital/analog converter of the present invention is designed to avoid the above-mentioned problems encountered by a conventional digital/analog converter. This is achieved by activating a current source located in the center of the current source array as well as two current sources located respectively on the left and right sides of the current source in the center so that their errors can be mutually offset with each other.

DETAILED DESCRIPTIONS OF PREFERRED EMBODIMENT OF THE INVENTION

In the following section, the embodiment of the present invention will be explained in more detail with reference to the attached drawings.

Figure 7:
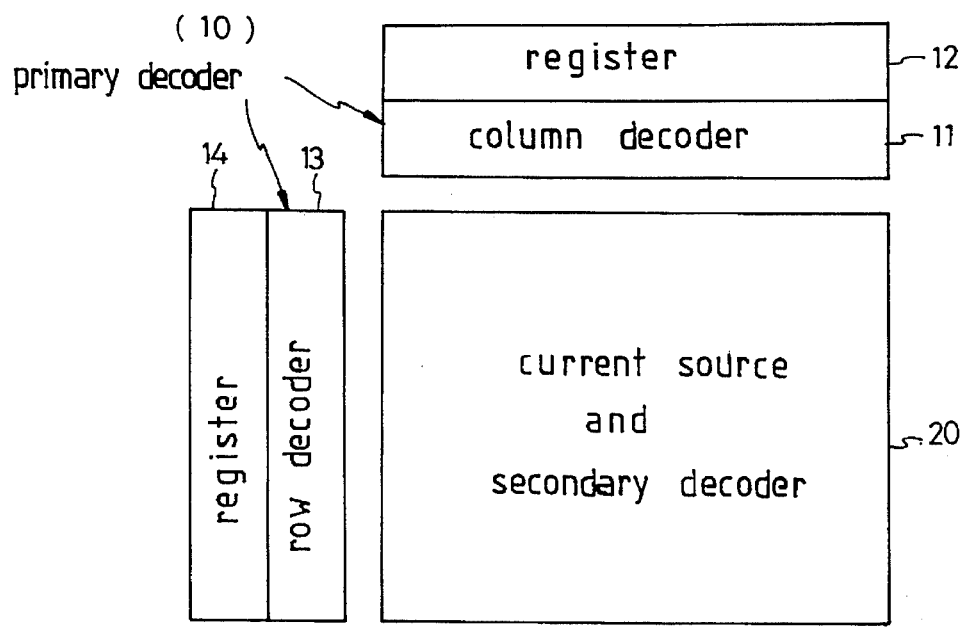
FIG. 7 is a block diagram of the digital/analog converter according to the embodiments of the present invention.

FIG. 7 is a block diagram of the digital/analog converter of the present invention. The digital/analog converter of the present invention is made of: a primary decoder 10 that has a column decoder 11 used to decode signals entering the column, a row decoder 13 used to decode signals entering the row, and registers 12,14 used to amplify signals entering the said column and row decoders 13, 11, and a current source and secondary decoder 20 that can flow the current and decode signals entering the column and row symmetrical to the said primary decoder 10.

Figure 1:
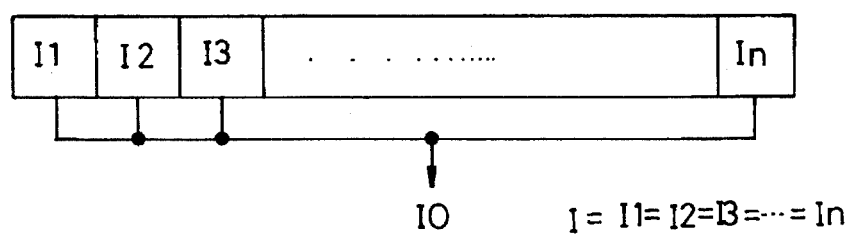
FIG. 1 is a diagrammatic illustration of a conventional digital/analog converter with an un-weighted thermometer method.
Figure 2:
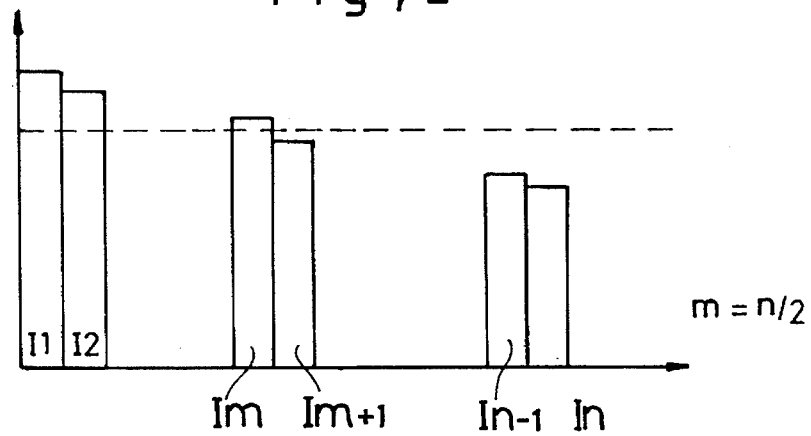
FIG. 2 is a graph depicting a current distribution of the current sources given in FIG. 1.
Figure 3:
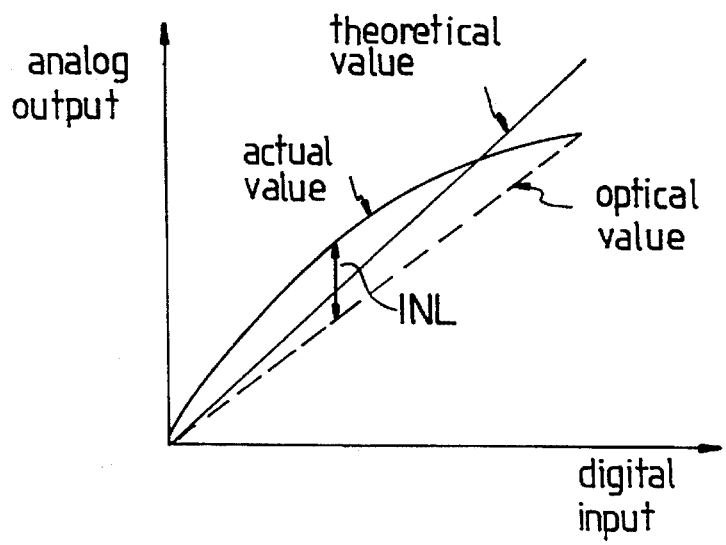
FIG. 3 is a graph depicting integral non-linearity error characteristics generated due to a current non-uniformity.
Figure 4:
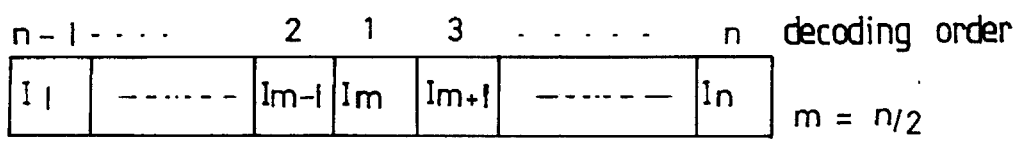
FIG. 4 is a diagrammatic illustration depicting the order of a digital/analog converter with a symmetric thermometer decoding method.
Figure 5:
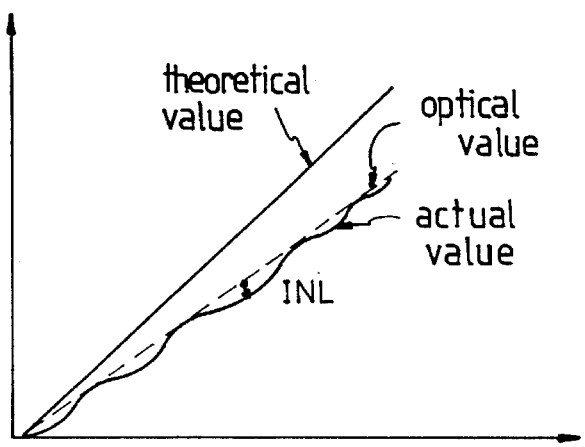
FIG. 5 is an output waveform according to FIG. 4.
Figure 6:
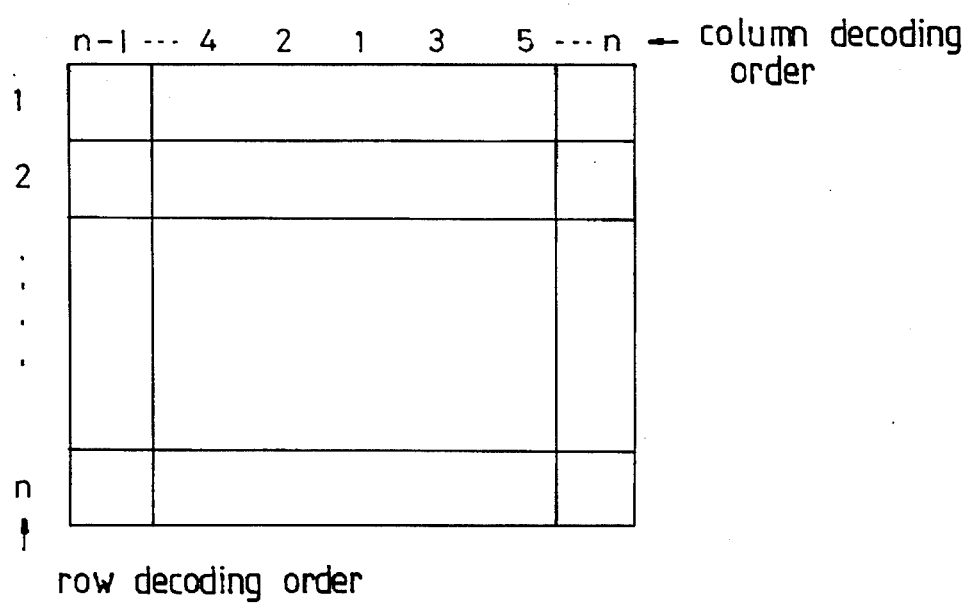
FIG. 6 is a diagrammatic illustration of a symmetric thermometer matrix decoding method of the present invention.

Next, a detailed description on the characteristics of the digital/analog converter of the present invention will be given. As shown in FIG. 6, a current source located in the center of the current source array is activated first, and then two current sources located to the right and the left side of the current source in the center are further activated so that they mutually offset the errors of each other, thereby reducing an integral non-linearity error. Also, by doing so, the distance of the current source array is decreased, thus reducing a differential non-linearity error which is an error within one digital input. However, when this method is used, only one direction, that is, to the column direction, is symmetrically decoded while nothing is done for the current gradient of the current sources on the rows.

Figure 9:
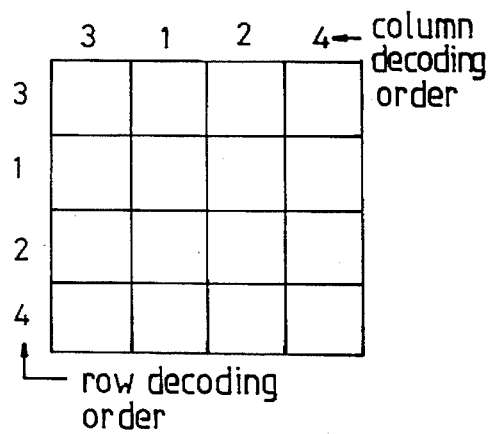
FIG. 9 is a diagrammatic illustration depicting a selection order of the current source mentioned in FIG. 7.

Accordingly, as shown in FIG. 9, a symmetric decoding is performed in the row direction in order to reduce the integral non-linearity error due to gradient of the current sources in the row direction which is a limitation of a symmetric thermometer decoding method. As an example, the current sources (4×4) that are selected when the digital input is 6 in decimal notation will be discussed.

Figure 10:
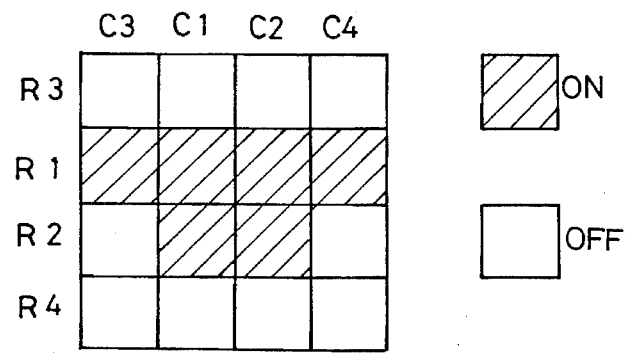
FIG. 10 is a diagrammatic illustration depicting a selection order of the current source that is selected when the digital input is 6 in decimal notation.

First, a primary decoder 10 is composed of a row decoder 13 and a column decoder 11. If the n+1th output of the decoder is "1", the nth output from the first output is always set to be "1". That is, in the case of FIG. 10, outputs of the row decoder for R1 and R2 become "1" and "0" for R3 and R4. Outputs of the column decoder for C1 and C2 become "1" and "0" for C3 and C4. These outputs enter the secondary decoder 20 as inputs. Also, registers 12,14 located on the front stage of the primary decoder 10 are used to synchronize signals that enter the column and the row decoder 11 and 13 of the primary decoder.

Figure 8:
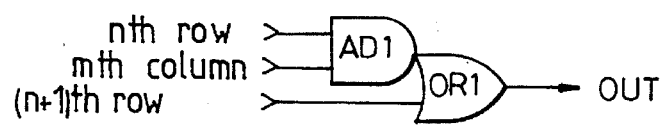
FIG. 8 is a two dimensional circuit diagram according to FIG. 7.

As illustrated in FIG. 8, the secondary decoder 20 is constructed in such a way that an AND gate AD1 receives the nth signal of the row and the mth signal of the column, and that an OR gate OR1 receives the n+1th signal of the row and the output signal of the AND gate AD1, and outputs them after performing ORing. Wherein, m, n are integers, and m=n/2. The secondary decoder 20 of the mth column and the nth row of the circuit thus constructed first evaluates whether a n+1 row has been selected; if it has been selected, the secondary decoder outputs "1", and if not, the secondary decoder evaluates the nth row and the mth column. That is, if the mth column is "1" when the nth row has been selected, the secondary decoder outputs "1" and if not, the secondary decoder outputs "0".

When the current gradient of the current sources that activate in this manner is 0.1% and 0.01%, the maximum number of bits that enter the digital/analog converter in respect to the integral non-linearity error are as follows; it should be noted that these are theoretical values, not measured values.

Thermometer decoding method: 6 bits, 8 bits

Symmetric thermometer method: 8 bits, 10 bits

Symmetric thermometer matrix method: 8 bits, 10 bits

Two dimensional symmetric thermometer matrix method: 10 bits, 2 bits

That is, the two dimensional symmetric thermometer matrix method is better than the conventional methods in terms of an integral non-linearity error and thus can be used to manufacture a digital/analog converter that is capable of providing a higher resolution. As discussed in detail so far, the present invention can be used not only for a digital/analog converter but also for chips that use such digital/analog converters. Also, the present invention can be applied to the manufacturing of high-resolution monitors and HDTV (High Definition TV). It should be noted that two-dimensional symmetry rows mean symmetrical to left as well as to right in a row and symmetrical to above and below when applied to a group of current sources, that is, among rows.

For reference, the selection orders of current sources when using the symmetric thermometer matrix decoding method and the two-dimensional symmetric thermometer matrix decoding method are given in the following tables.

TABLES

| 3 | 1 | 2 | 4 | | 3 | 1 | 2 | 4 | |
|---|---|---|---|---|---|---|---|---|---|
| 3 | 1 | 2 | 4 | 1 | 3 | 11 | 9 | 10 | 12 |
| 7 | 5 | 6 | 8 | 2 | 1 | 3 | 1 | 2 | 4 |
| 11 | 9 | 10 | 12 | 3 | 2 | 7 | 5 | 6 | 8 |
| 15 | 13 | 14 | 16 | 4 | 4 | 15 | 13 | 14 | 16 |
| Symmetric Thermometer Matrix Decoding Method | | | | | Two-dimensional Symmetric Thermometer Matrix | | | | |

TABLES-continued

| 3 | 1 | 2 | 4 | 3 | 1 | 2 | 4 |
|---|---|---|---|---|---|---|---|
| (4 × 4 Current Sources) | | | | Decoding Method (4 × 4 Current Sources) | | | |

This invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed:

1. A two-dimensional symmetric thermometer matrix decoder of a digital/analog converter comprising:

a primary decoder including a column decoder used to decode signals entering the column, a row decoder used to decode signals entering the row, and registers used to synchronize signals entering the said column decoder and the said row decoder; and a current source and a secondary decoder that can flow the current and decode signals entering the column and the row symmetrical to the said primary decoder said secondary decoder comprising an AND gate having a first input which receives the nth signal of the row and a second input which receives the mth signal of the column; and an OR gate having a first input which receives the n+1th signal of the row and a second input which receives an output signal of the said AND gate, and outputs it after performing ORing, in which m, n are integers, and m=n/2.

* * * * *